United States Patent [19]
Nightingale et al.

[11] Patent Number: 6,151,342
[45] Date of Patent: Nov. 21, 2000

[54] BRIGHT DIODE-LASER LIGHT-SOURCE

[75] Inventors: John L. Nightingale, Portola Valley; Michael Hmelar, Palo Alto; C. David Nabors, Sunnyvale, all of Calif.

[73] Assignee: Coherent, Inc., Santa Clara, Calif.

[21] Appl. No.: 08/986,540

[22] Filed: Dec. 8, 1997

[51] Int. Cl.[7] .................................................. H01S 3/043
[52] U.S. Cl. ............................................................ 372/36
[58] Field of Search ................................................ 372/36

[56] References Cited

U.S. PATENT DOCUMENTS

| | | | |
|---|---|---|---|
| 4,716,568 | 12/1987 | Scifres et al. | 372/36 |
| 4,820,010 | 4/1989 | Scifres et al. | 385/43 |
| 4,881,237 | 11/1989 | Donnelly | 372/50 |
| 5,012,477 | 4/1991 | Mesquida et al. | 372/50 |
| 5,268,978 | 12/1993 | Po et al. | 385/33 |
| 5,394,492 | 2/1995 | Hwang | 385/33 |
| 5,629,997 | 5/1997 | Hardy, Jr. | 385/33 |
| 5,828,683 | 10/1998 | Feritas | 372/36 |
| 5,987,043 | 11/1999 | Brown et al. | 372/36 |

FOREIGN PATENT DOCUMENTS

| | | | |
|---|---|---|---|
| 04264789 | 9/1992 | European Pat. Off. | H01S 3/18 |
| 0 717 476 A1 | 6/1996 | European Pat. Off. | H01S 3/00 |
| 2 153 969 | 10/1971 | Germany . | |
| 2 153 969 | 5/1973 | Germany . | |
| 4-264789 | 9/1992 | Japan | H01S 3/18 |

OTHER PUBLICATIONS

International Search Report in International Application No. PCT/US98/14653, mailed Oct. 26, 1998, 7 pages in length.

K.A. McGreer, et al., "Integration of Tunable Segmented Lasers and Electrically Pumped Combiner for WDM," Proceedings of the European Conference on Optical Communication , (EC Montreux, Sep. 12–16, 1993, Regular Papers), vol. 2, No. Conf. 19, Sep. 12, 1993, pp. 265–268.

*Primary Examiner*—James W. Davie
*Attorney, Agent, or Firm*—Limbach & Limbach L.L.P.

[57] ABSTRACT

A light-source includes a plurality of diode-laser bars. The diode-laser bars are arranged in a parallel array and arranged to emit laser-light in the same direction. The diode-laser bars are spaced-apart from each other in the emission-direction. Optical-waveguides are provided for collecting laser-light emitted from each of the diode-laser bars and delivering the collected laser-light to an output aperture of the light-source.

22 Claims, 8 Drawing Sheets

BRIGHT DIODE-LASER LIGHT-SOURCE

TECHNICAL FIELD OF THE INVENTION

The present invention relates in general to light sources including an array of diode-laser bars. The invention relates to a bright, diode-laser light-source including a plurality of diode-laser bars spaced apart from each other in the laser-light emission direction thereof, emitted laser-light being coupled into an array of optical-waveguides.

DISCUSSION OF BACKGROUND ART

Diode-lasers provide a most efficient and compact means of light generation and are attractive as light-sources in many applications, particularly those in which light is required only in a limited range of wavelengths. Such applications include, for example, medical applications such as photodynamic therapy and depilation; machining, welding, and heat treating using light; providing pump-light-sources for solid state lasers; and simply providing illumination.

Diode-laser light-sources are frequently in the form of a "bar" which includes a plurality of individual lasers on a single semiconductor substrate. The lasers emit from the edge of the bar in a direction perpendicular to the length of the bar. Where one bar is insufficient to provide a desired power or brightness, an array of bars is used, one stacked above the other in a direction perpendicular to the emitting direction. Such an arrangement is usually referred to as a stacked bar array, or a two dimensional array of emitters.

The closer the bars are stacked, the brighter the array will be. Where the closely stacked bars are operated at high power or rapid pulse rates, however, problems are often encountered in removing heat generated during operation of the bars.

More or less effective solutions to the heat removal problem for such stacked bar arrays have been devised in the prior art. These solutions involve cooling arrangements which are often relatively complex compared with corresponding cooling arrangements for single diode-laser bar. Such arrangements may include complex mechanical assemblies, including cooling fins or microchannel plates. Because of this, the cost of a stacked diode-laser bar array can be increased significantly over the total cost of a comparable number of individual diode-laser bars.

SUMMARY OF THE INVENTION

The present invention is directed to providing an array of diode-laser bars, the collective laser-light output of which is used to provide a light-source. The invention is further directed to providing such a light-source wherein the diode-laser bar array is configured to avoid concentration of heat generated by the diode-laser bars.

In one aspect, the present invention comprises a plurality of diode-laser bars, each thereof having a front surface. The front surface has a plurality of diode-laser emitting-areas therein. The diode-laser bars are arranged in an array with the front surfaces thereof facing in the same direction, i.e., the direction in which laser-light is emitted from the diode-laser emitting-areas. The diode-laser bars are spaced-apart from each other in that direction. Means are provided for collecting laser-light emitted from each of the diode-laser bars and delivering the collected laser-light to an output aperture of the light-source.

In one preferred embodiment of the present invention, the diode-laser bars are mounted on a single flat surface of a common heat-sink. The diode-laser bars are preferably spaced apart by a distance such that the heat-sink area for a bar is at least twice the area of the bar.

Laser-light collecting means are preferably provided by a plurality of optical-waveguides, one associated with each of the diode-laser bars. Each of the optical-waveguides has an elongated, generally rectangular entrance-face, and an exit-face. The entrance-face is located proximate the front surface of the said diode-laser bar with which it is associated for receiving laser-light emitted from the diode-laser emitting-areas. The received laser-light propagates along the optical-waveguide to the exit-face thereof.

A preferred method of assembling a light-source in accordance with the present invention, comprises providing a substrate or heat sink for supporting the array of diode-laser bars. A plurality of elongated mounting areas each thereof having the approximate dimensions of a diode-laser bar is formed on the substrate, the mounting areas being spaced-apart and generally parallel to each other. A layer of solder is deposited on each of the mounting areas. A diode-laser bar is placed on each of said mounting areas with front surfaces of the diode-laser bars facing in the same direction. The solder layers are then melted, thereby centering the diode-laser bars on the mounting areas. The solder layers are then solidified, thereby bonding the diode-laser bars on the mounting areas.

A particular advantage of a light-source in accordance with the present invention, compared with prior-art stacked-bar diode-laser light-sources, is that heat generated by the diode-lasers during operation is not concentrated into a restricted zone. Because of this, the generated heat may be moved by a simple heat-sink arrangement similar to, albeit longer than, heat-sink arrangements commonly used in diode-laser light-sources incorporating only a single diode-laser bar. This and other advantages will be evident from the detailed description of the present invention provided hereinbelow.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
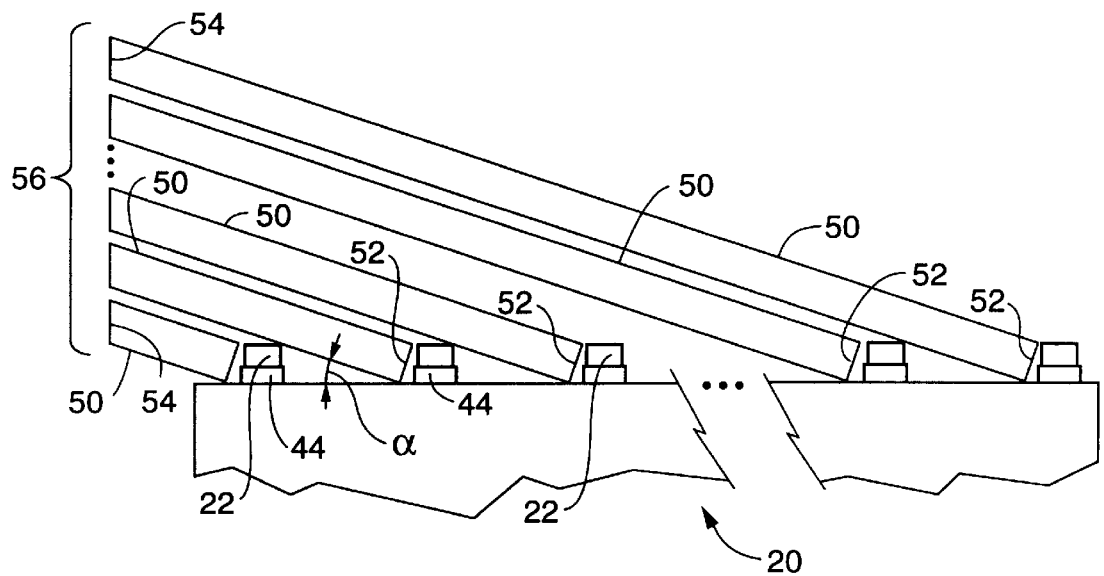
FIG. 1 is an elevation view schematically illustrating one preferred embodiment of a light-source in accordance with the present invention, including an array of diode-laser bars with emitting surfaces thereof oriented in the same direction, the diode-laser bars being spaced apart in that direction and mounted on a flat surface of a common heat-sink, with an optical-waveguide, inclined to the flat surface, proximate each diode-laser bar for collecting laser-light therefrom.
Figure 2:
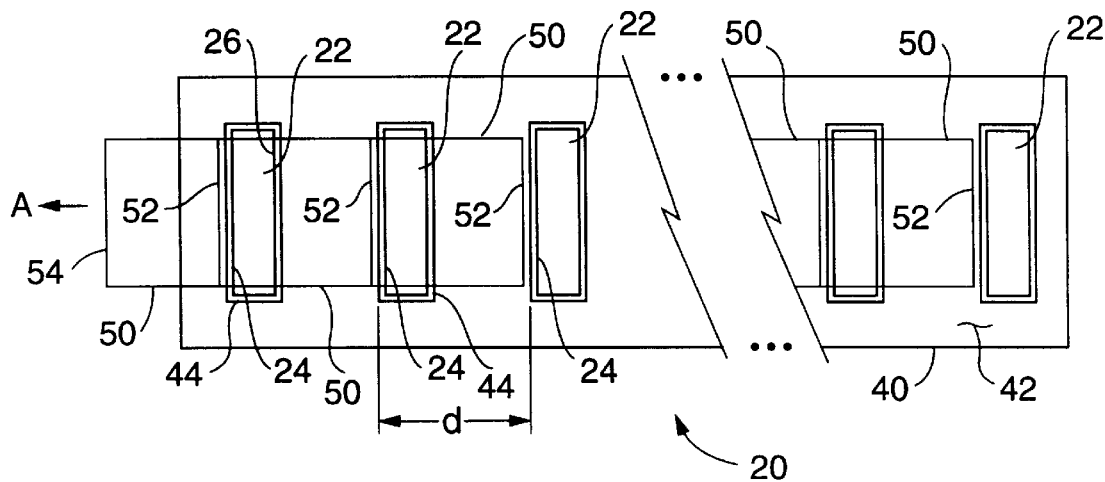
FIG. 2 is a plan view from above, schematically illustrating the light-source of FIG. 1.
Figure 3:
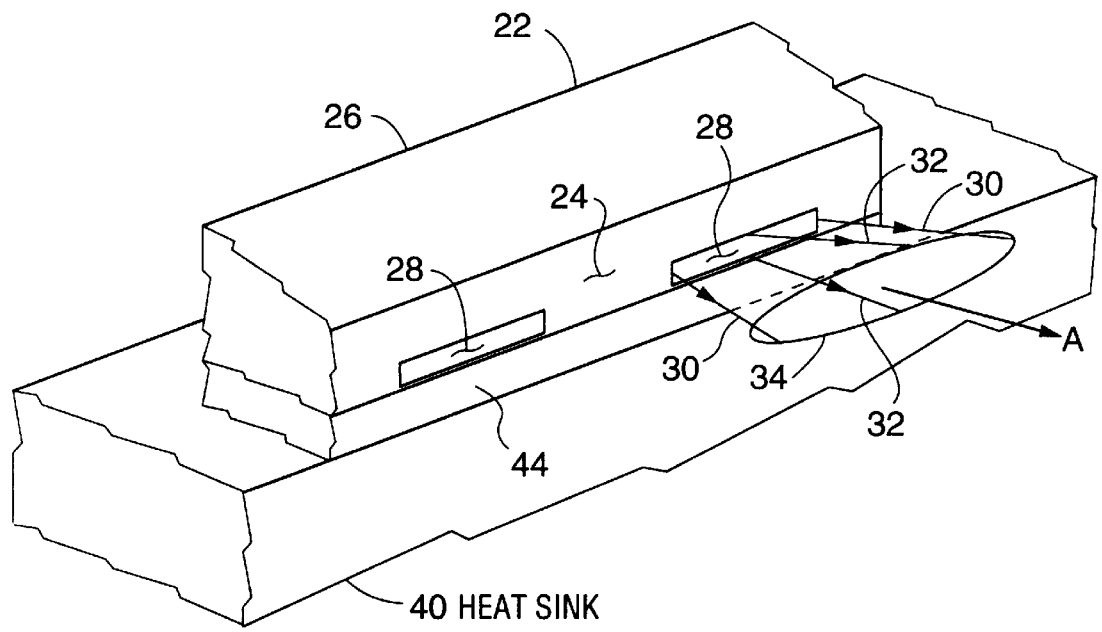
FIG. 3 is a fragmentary perspective view schematically illustrating laser-light emitting facets of a front surface of a diode-laser bar of FIG. 1.

Turning now to the drawings, wherein like components are designated by like reference numerals, FIG. 1, FIG. 2 and FIG. 3 schematically illustrate one preferred embodiment of a light-source 20 in accordance with the present invention. Light-source 20 includes a plurality of one-dimensional diode-laser arrays (diode-laser bars) 22. Each diode-laser bar includes a front-surface or front-facet 24, and a rear surface or rear facet 26. Each diode-laser bar incorporates a plurality of diode-lasers each of which has an emitting-area 28 (see FIG. 3) in front surface 24 of the diode-laser bar. Other structural details of diode-lasers in a bar are well known to those familiar with the art to which the present invention pertains and, accordingly, are not depicted or discussed herein.

Laser-light is emitted from an emitting-area generally in a direction indicated by arrow A, about perpendicular to the emitting-area, and accordingly, front surface 24. An emitting-area is usually three to one-hundred or more micrometers ($\mu$m) wide by about 1 $\mu$m high. The term laser-light as used in this direction and in the appended claims is meant to encompass electromagnetic radiation at ultraviolet and infrared wavelengths as well as visible wavelengths. Laser-light from the emitting-area is emitted in the form of a divergent beam, exemplified by rays 30 and 32 (see FIG. 3). The beam diverges more strongly in the height direction of emitting-area 28 (rays 32) than in the width direction (rays 30). The beam has an elongated, somewhat-elliptical cross-section 34 in the vicinity of the emitting-area. Diode-laser bars 22 are arranged substantially parallel to each other with front surfaces 24 thereof facing in emission-direction (A).

Diode-laser bars 22 are preferably mounted on a common heat-sink 40 on a flat surface 42 thereof. Heat-sink 40 may be formed from a heat conductive ceramic material such as beryllia or alumina, or from a metal such as copper provided with, optionally, an electrically-insulating pads or an electrically-insulating coating on which diode bars can be mounted. Heat-sink 40 may be passive in operation, or may be actively cooled, for example, by a circulating fluid, or by thermoelectric cooling means in contact with a surface (not shown) opposite to surface 42. As design of such heat-sinks is well known in the art, a detailed description is not presented herein.

The diode laser bars may be mounted for either series or parallel connection. The present invention is not limited by the manner in which the diode laser bars are electrically interconnected. For series connection, each diode-laser bar 22 is mounted on an electrically-conductive "island" 44 having about the same dimensions as a diode-laser bar. Adjacent islands 44 are electrically isolated from each other. An island 44 is preferably between about 10.0 and 500.0 $\mu$m thick and serves as a pedestal or spacer for raising a diode-laser bar 22 above surface 42. The (length) dimension of an island may be extended in a direction perpendicular to the emission direction (A) to facilitate electrical connection to a diode-laser bar mounted thereon.

Islands 44 may be conveniently formed by lithographically patterning and plating. Islands may also be formed by laser machining. An island 44 may be a simple conductor or composite structure formed from a conductor and an insulator. Whatever means are employed for mounting diode-laser bars 22, it is important that they are mounted in a way which ensures good heat-flow therefrom to the heat-sink.

Preferably a diode-laser bar 22 is attached to an island 44 by a reflow soldering method. In a preferred reflow soldering method, a plurality of island areas 44 are produced on heat-sink 44. The number of islands corresponds to the number of diode-laser bars to be mounted. Each of these islands has about the same dimensions as a diode-laser bar to be mounted thereon. The islands are spaced apart from each other and aligned with respect to each other corresponding to the desired spacing and alignment of diode-laser bars.

A layer of solder, preferably a low melting point soft solder such as an indium solder, is deposited on each of the islands. The layer should be sufficiently thick that, when melted, it can wet the surface of the island and a diode-laser bar placed thereon, but preferably not so thick that a significant quantity of solder can escape from the junction between the diode-laser bar and the island. Even a relatively small amount of escaped excess solder may wet front surface 24 of a diode-laser bar to an extent where emitting-areas 28 thereof, which are located very close to the diode-laser bar/island junction, are contaminated. For indium solder a preferable thickness is about 7 $\mu$m this thickness should not, however, be considered limiting. According to the above-discussed criteria, a suitable thickness for a particular solder can be readily determined by simple experiment.

Once the solder layer has been deposited, diodes to be mounted are placed on corresponding islands in approximate alignment therewith. The heat-sink and diode-laser bars are then placed in an oven wherein the temperature is raised to a point sufficient to melt the solder layer on the islands. This melting preferably takes place in a reducing atmosphere, such as hydrogen or forming gas, to remove any oxide skin on the molten solder. Preferably a vacuum is also created in the oven which serves to eliminate any trapped gas from the solder-filled junctions between diode-laser bars and islands. Equilibration of surface tension forces in the molten solder layer at the periphery of the diode-laser bar/island junction, automatically and precisely aligns the diode-laser bars with the islands on which they are mounted. The solder is then allowed to cool and solidify, thereby bonding the diode-laser bars to the islands.

Continuing now with reference to FIGS. 1 and 2, light emitted from emitting-areas 28 of all diode-lasers in a diode-laser bar 22 are collected by an approximately rectangular optical-waveguide 50. Each optical-waveguide 50 has an entrance-face 52 thereof located proximate front-surface 24 of a diode-laser bar 22 with which it is associated for receiving light emitted from facets 28. The optical-waveguide preferably has a width sufficient to extend over all emitting-areas 28 in a diode-laser bar 22, and preferably has a height (thickness) at least about equal and preferably greater than an emitting-area 28. Exit faces 54 of optical-waveguides 50 may be collected together as illustrated in FIG. 1 to form an output aperture 56 for light-source 20.

A rectangular waveguide can be a simple glass plate polished on all sides, or may be fabricated using a pre-form and drawing the pre-form into an approximately rectangular shape. An unclad glass-plate waveguide may have dimensions about n×10 mm×p, where n is between about 3 and 100 mm, and p is between about 0.1 mm and 2 mm. A glass plate clad with an optical epoxy would have about the same core dimensions. A drawn "ribbon" waveguide may have a thickness between about 50 $\mu$m and 300 $\mu$m. A ribbon fiber may be clad, with cladding thickness being between about 2 $\mu$m and 500 $\mu$m. Waveguide losses can be minimized by providing an antireflection of entrance an exit faces 52 and 54. A waveguide may also be formed from a plastic material, or may be in the form of a hollow metal conduit. A waveguide may be converging (tapered) or diverging with straight or curved sidewalls.

The arrangement of light-source 20 has certain advantages in the area of manufacturing costs. For example, islands 44 for mounting diode laser bars 22 on heat-sink 40 may be inexpensively applied by conventional substrate patterning techniques well-known in the electronic industry. Further, the above discussed reflow soldering process allows bonding an accurately aligning the plurality of diode-laser bars 50 on corresponding islands 44 in a single operation. The arrangement of light-source 20, however, requires that waveguides 50, if rigid, must be inclined to surface 42 of heat-sink 40 at an angle $\alpha$ in order to clear an adjacent diode laser bar. This constraint, of course would not apply to a flexible or bent waveguide 50.

The inclination angle is preferably between about 5° and 40°. A minimum value for angle a depends on the height and spacing of diode-laser bars 22, One example of preferred dimensions of a light-source 20, including waveguide inclination, are set forth below, with reference to a light-source 20 including ten diode-laser bars.

Typical dimensions of a diode-laser bar 22 are about 10.0 (millimeters) mm long×1.0 mm wide×130.0 $\mu$m high. Preferably, diode-laser bar 22 is mounted on island 44 at a height of about 50.0 $\mu$m above surface 42 of heat-sink 40. An electrical connection (not shown) on top of diode-laser bar 22 is about 50.0 $\mu$m thick. The top of the electrical connection would thus be about 230.0 $\mu$m above surface 42.

Spacing of diode-laser bars 22 is preferably sufficient that the heat-sink area available per bar is greater than about twice the area of a bar. A preferred spacing is about 3.0 mm (front-surface to front-surface). At this spacing, ten diode-laser bars could be accomodated on a heat-sink 40 of length about 30.0 mm with adequate space for electrical connections and the like. At a 3.0 mm spacing, a minimum waveguide-inclination angle is about 6.56°. Assuming that optical-waveguides 50 are straight and rigid, the distance between optical-waveguides 50 (center-to-center) is about 345.0 $\mu$m. Optical-waveguides 50 preferably have a minimum height of about 50 $\mu$m, but are preferably no thicker than 345.0 $\mu$m to avoid interference one-with-another. A waveguide spacing (pitch) of 345.0 $\mu$m would provide, for diode laser bars 22 having about 20.0 Watts (W) output power, that source 20 would deliver about 200.0 W output from a rectangular aperture about 10.0 mm long and 3.5 mm high.

While optical-waveguides 50 have been described above as having a flat entrance-face 52, which is depicted in FIG. 1 as being perpendicular to the length of a waveguide, this should not be considered limiting.

Figure 4:
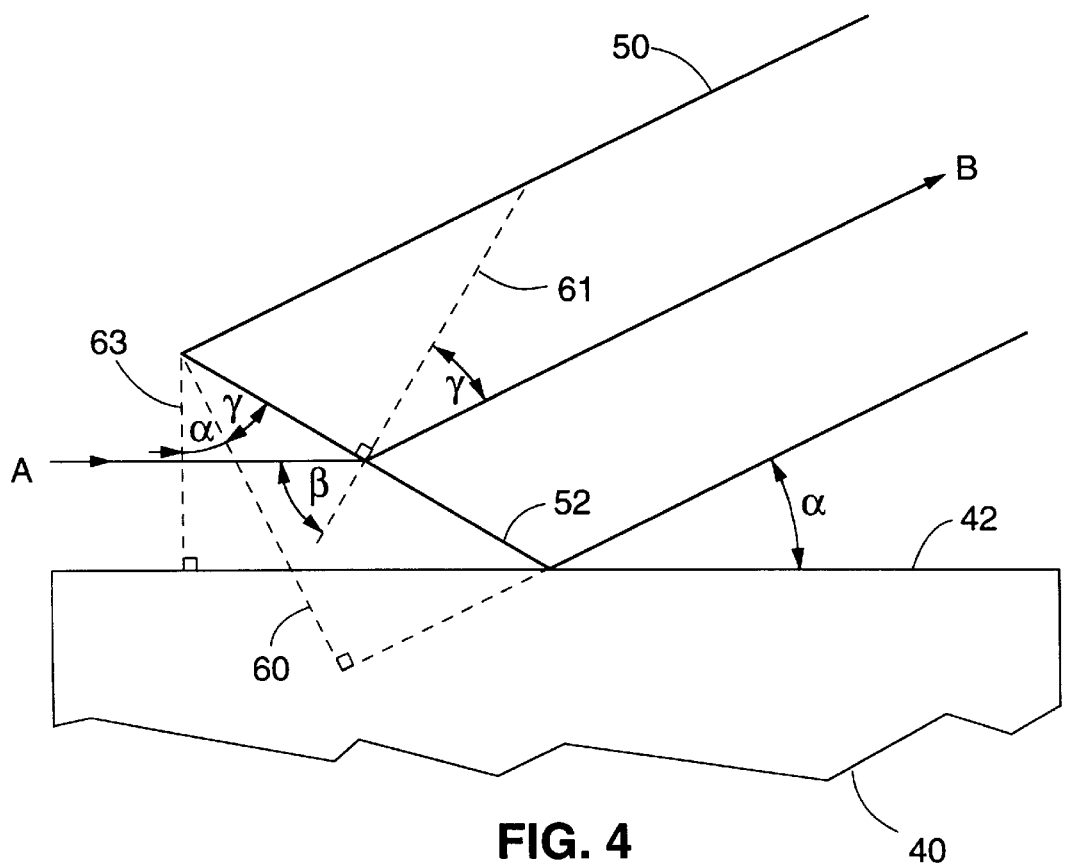
FIG. 4 is an elevation view schematically illustrating an arrangement for improving coupling of laser-light into an optical-waveguide in the light-source of FIG. 1 including an optical-waveguide having an entrance-face inclined at a wedge-angle to a plane perpendicular to the length direction of the optical-waveguide for refracting coupled laser light in a direction parallel to the length direction of the optical waveguide.

A simple but effective means of improving coupling into an inclined optical-waveguide in accordance with the present invention is to incline entrance-face 52 at an angle to the length of the optical-waveguide such that light from a diode-laser bar 22 is refracted from entrance face 52 in a direction parallel to the inclination-angle $\alpha$ of the optical-waveguide as illustrated in FIG. 4.

Here, surface 52 of optical-waveguide 50 is inclined at an angle $\gamma$ to a plane 60, perpendicular to the length direction of optical-waveguide 50, and in a direction away from output-face 24 of diode-laser bar 22. Angle $\gamma$ is referred hereinafter as the wedge-angle of entrance face 52. Plane 60 is inclined at angle to a plane 63 perpendicular to surface 42. Angle $\beta$ (measured from a normal 61 to surface 52) at which beam A is incident on face 52 is equal to the sum of angles $\alpha$ and $\gamma$ as is evident from FIG. 4. Arrow A indicates the principal ray direction of light emitted from an emitting area 28 of a diode-laser bar 22 (see FIG. 3). Arrow B represents the direction of principal ray A after refraction at surface 52. When (as illustrated in FIG. 4) arrow B is in a direction parallel to the length direction of waveguide 50, the refraction angle of the principal ray in the waveguide is the wedge angle $\gamma$ and the relationship between $\alpha$ and $\gamma$ is given by an equation:

$$\alpha = \sin^{-1}(n \sin \gamma) - \gamma \qquad (1)$$

where n is the (core) refractive index of optical-waveguide 50.

Figure 5:
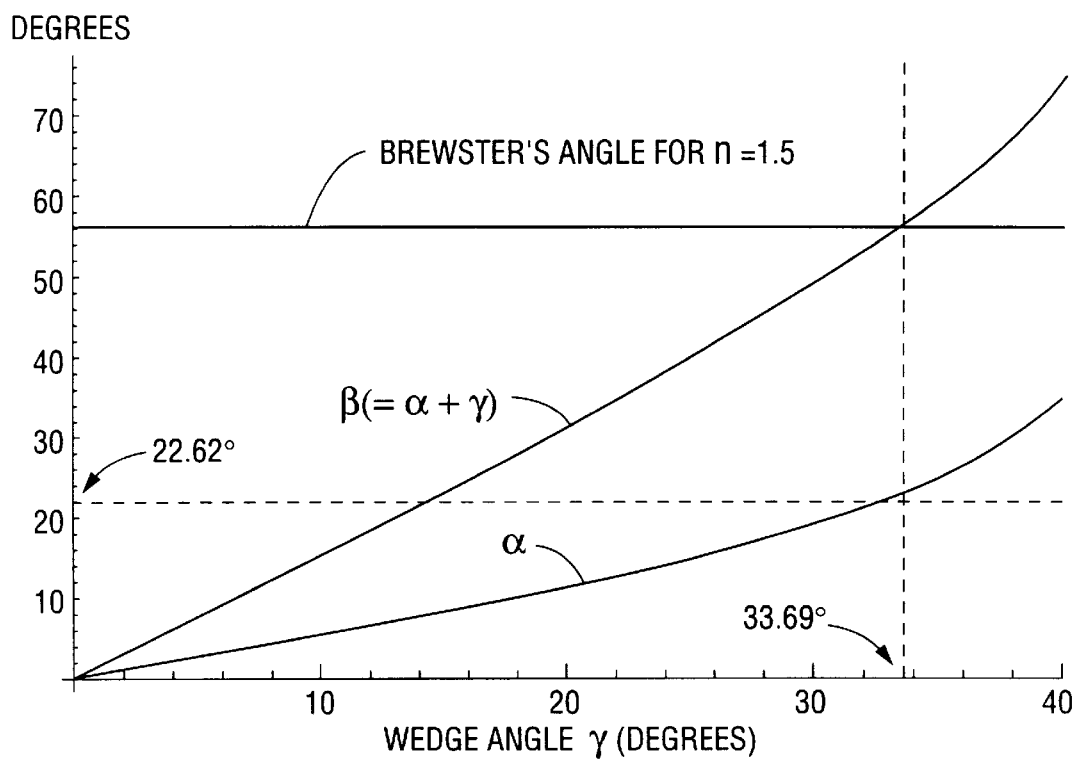
FIG. 5 is graph schematically illustrating computed wedge-angle and incidence angle as a function of wedge-angle inclination in the arrangement of FIG. 4 for the refracted-light condition of FIG. 4.

The relationship of equation (1) is depicted graphically in FIG. 5 wherein computed inclination angle and incidence angle are plotted as a function of wedge angle $\gamma$ for an optical-waveguide 50 having a core refractive index of 1.5. Brewster's angle for a medium of refractive index 1.5 (56.31°) is also shown. It can be seen that there is a combination of optimum wedge and inclination angles which provide Brewster's angle incidence on surface 52. For n=1.5 this is provided at an inclination-angle $\alpha$=22.62° with wedge-angle $\gamma$=33.69°.

It will be evident to those skilled in the art, without further description, that the above-described wedge angle principle can be applied to exit faces 54 of an optical-waveguide 50 for controlling the angle of an ouput beam. Further, it should be noted here that above-discussed calculations consider only the principal ray of a beam emitted from an emitting-area 28. As depicted in FIG. 3, an emitted beam includes light, 30 and 32, emitted in a cone around the principal ray (emission-direction A) To accommodate this, waveguide 50 is preferably fabricated with a numerical aperture (NA) to capture the cone of rays emitted from emitting-area 28.

Figure 6:
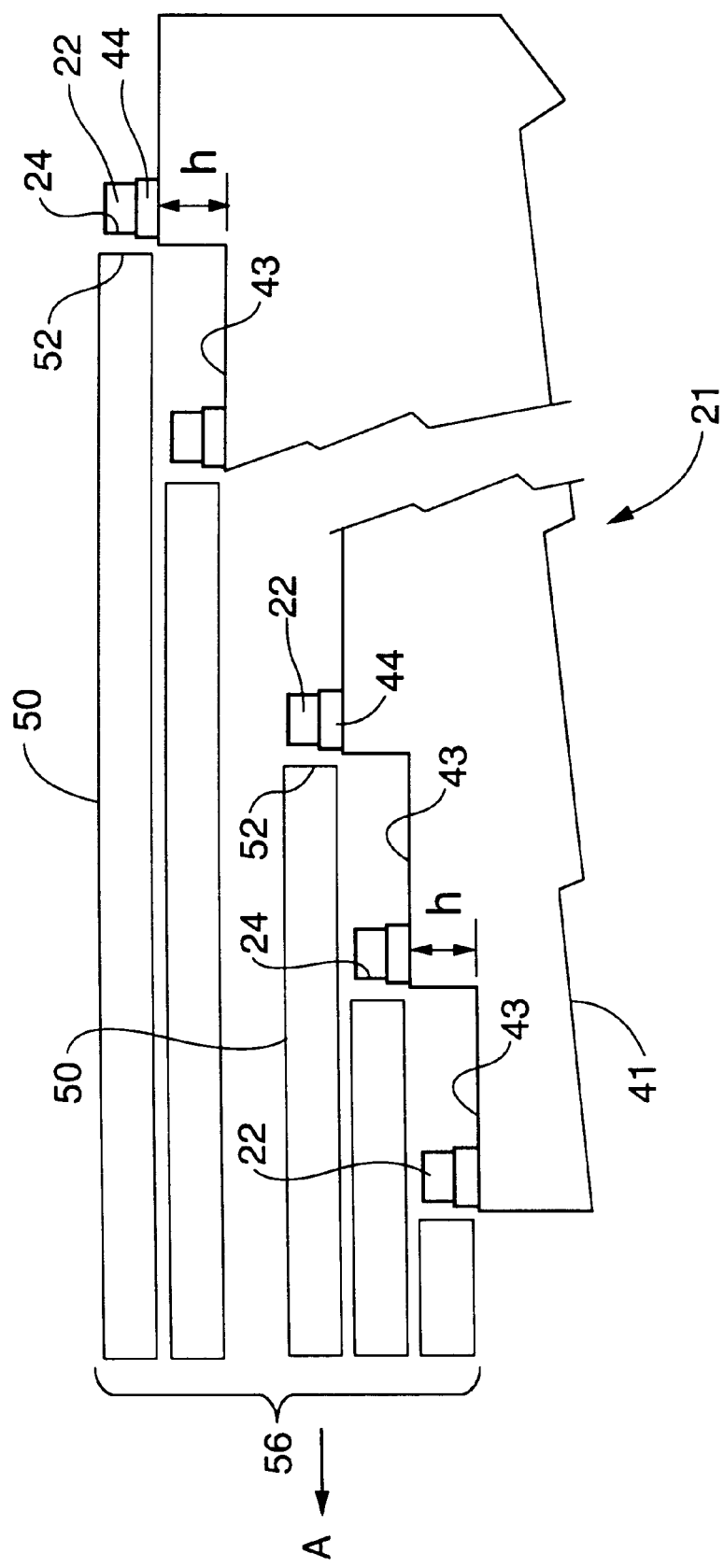
FIG. 6 is an elevation view schematically illustrating another preferred embodiment of a light-source in accordance with the present invention including an array of diode-laser bars, the diode-laser bars being spaced apart as depicted in FIG. 1, with individual ones thereof mounted on a particular step of a stepped surface of a common heat-sink.

Referring now to FIG. 6, another preferred embodiment 21 of a light-source in accordance with the present invention is illustrated. Light-source 21 includes a parallel array of diode-laser bars 22, spaced-apart in the emission-direction (A) thereof. Optical-waveguides 50 (one for each diode-laser bar) collect light from the diode-laser bars for delivery to common aperture 56.

Diode-laser bars 22 are mounted, via islands 44, on a heat-sink 41. Heat-sink 41 has an upper surface formed into a series of steps 43, one thereof for each diode-laser bar in the array. Each step 43 is vertically spaced by a height h from an adjacent step. Height h is selected such that an optical-waveguide 50 may be oriented parallel to emission direction (A) of the diode-laser bars. In this orientation, a plane entrance-face 52 of an optical-waveguide 50 is preferably perpendicular to emission direction (A). It is pointed out here that as steps 43 provide any required height of a diode-laser bar 22 above a surface on the emitting-side of the bar, islands 44 may be omitted from the arrangement of FIG. 6, unless required for bonding or insulation purposes.

The need to provide for a stepped surface for vertically spacing diode-laser bars 50 in the arrangement of FIG. 6 may lead to increased manufacturing costs compared with the arrangement of light-source 20. These increased costs may be incurred, for example, in providing steps 43 in heat-sink 41.

Figure 7:
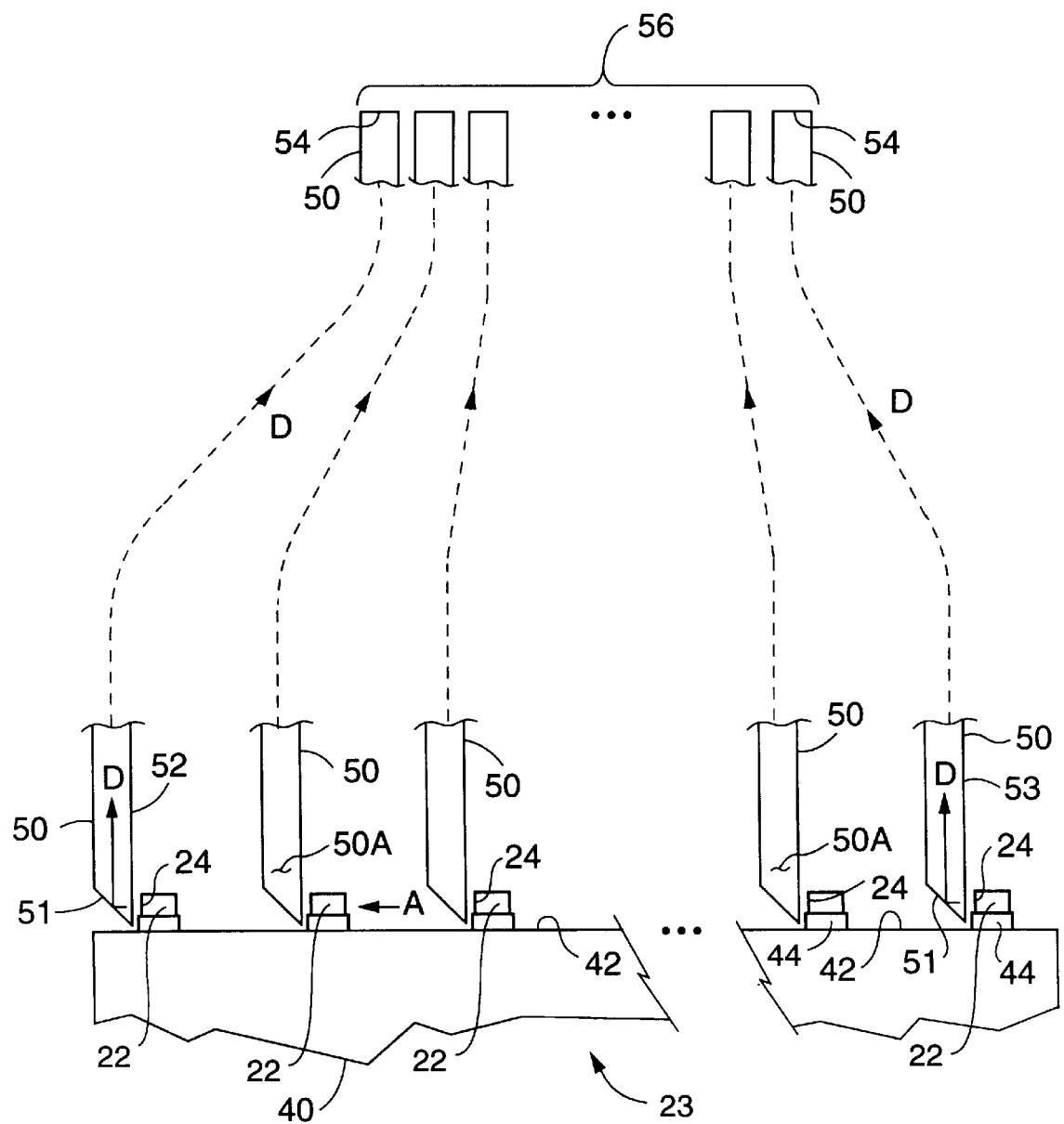
FIG. 7 is an elevation view schematically illustrating yet another preferred embodiment of a light-source in accordance with the present invention, including an array of diode-laser bars with emitting surfaces thereof oriented in the same direction, the diode-laser bars being spaced apart in that direction and mounted on a flat surface of a common heat-sink, with an optical-waveguide, perpendicular to the emitting-direction, proximate each diode-laser bar for collecting laser-light therefrom.

Referring next to FIG. 7, yet another preferred embodiment 23 of a light-source in accordance with the present invention is illustrated. Here, diode-laser bars 22 are mounted on flat surface 42 of heat-sink 40 via islands 44, as in light-source 20 of FIG. 1. In light-source 23, however, optical-waveguides 50 at an entrance end 50A thereof have an end-face 51 thereof polished at an angle to the length direction of the optical-waveguide. The optical-waveguides are aligned with front surface 24 of the diode-laser bars and oriented with their length direction about perpendicular to the emission-direction of the laser diode-bars. Light emitted from the a diode-laser bars 22 enters a optical-waveguide 50 laterally through a flat (guiding) surface 53 thereof and is reflected internally end-face 51 to be guided along the optical-waveguide generally in a direction D. End-face 51 is preferably furnished with a reflective coating, such as a metal coating, or a multilayer dielectric coating. The coating reflects that part of light incident of surface 51 which is not reflected by total internal reflection (TIR). End-face 51 is preferably at an angle between about 40 and 50 degrees to the emission direction A. Individual optical-waveguides 50 may be bent, as indicated in FIG. 7 by broken lines, such that exit-faces 54 thereof can be collected together to form output-aperture 56 for reducing the emitting-area of light-source 23.

Figure 8:
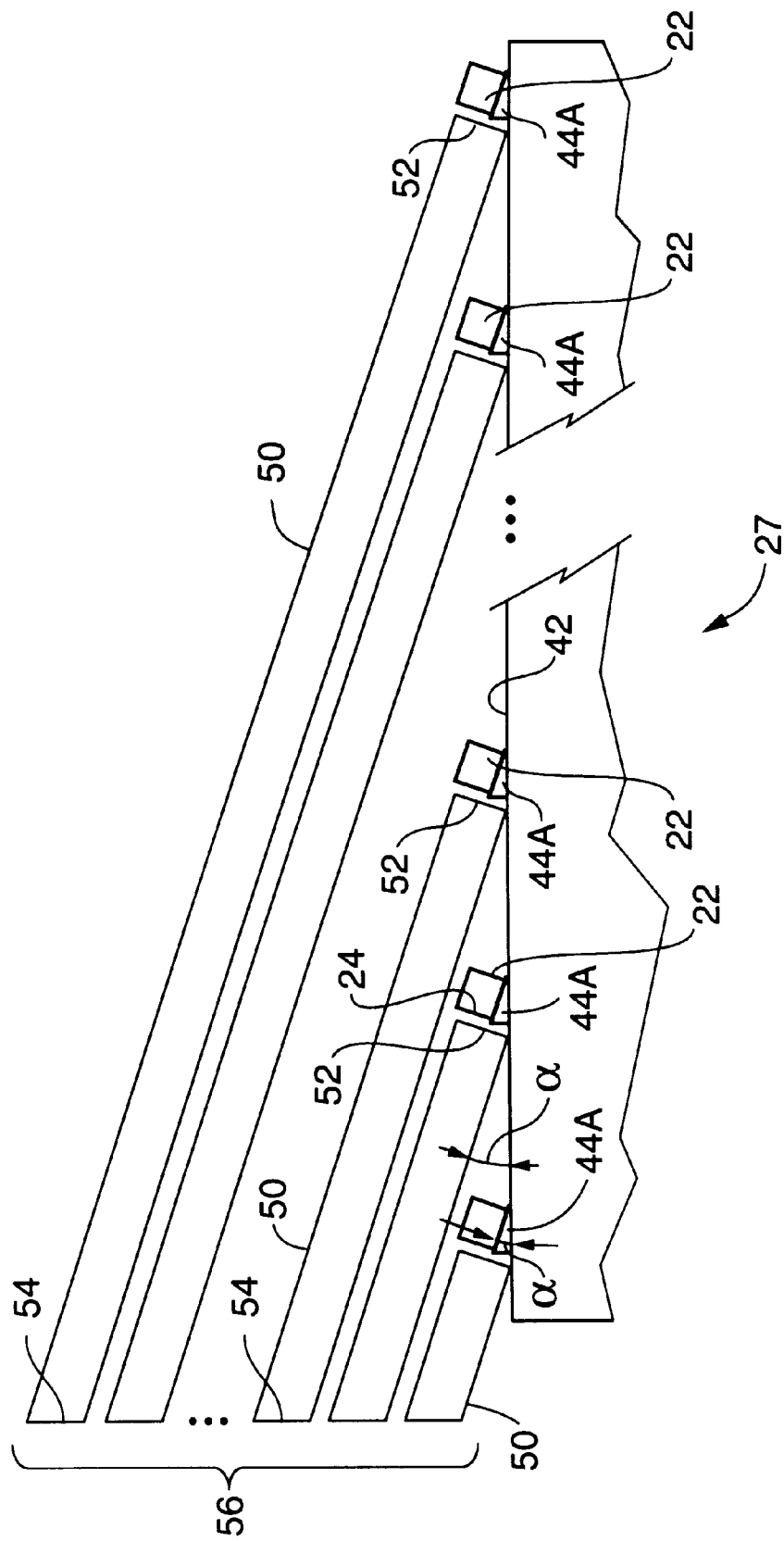
FIG. 8 is an elevation view schematically illustrating still another preferred embodiment a light-source in accordance with the present invention, similar to the embodiment of FIGS. 1 and 2, but wherein diode-laser bars are inclined at the same angle as optical-waveguides to facilitate coupling of emitted laser-light thereto.

Referring now to FIG. 8, still another embodiment 27 of a light-source in accordance with the present invention is depicted. Light-source 27 is similar in most respects to light-source 20 of FIGS. 1 and 2, with the exception that islands 44 of light-source 20 have been replaced with islands 44A which have an upper surface thereof inclined at the same angle a to surface 42 as an optical-waveguide 50. A diode-laser bar 22 bonded to the inclined surface of an island 44 will have front surface 24 (and emitting-areas 28) thereof inclined parallel to entrance-face 52 of optical-waveguide 50. This provides that convenient coupling of emitted laser-light into an inclined waveguide 50 can be achieved without polishing entrance-face 52 thereto at a particular angle as discussed above with reference to FIG. 4.

It should be noted here that in light-sources 20, 21 and 23, the above-discussed arrangement and rectangular, unclad form of optical-waveguides 50 should not be considered limiting. While this form and arrangements of waveguides are preferred, among others, for reasons of simplicity of assembly, and in the interest of reducing fabrication cost, other waveguide forms, clad or unclad, may be used without departing from the spirit and scope of the present invention. By way of example, optical-waveguides 50, having a rectangular entrance-face 52 may be bent, tapered or even progressively changed in cross-section to provide respectively a different location or different dimension of output-aperture 56, for providing a different propagating numerical aperture for laser-light, or for homogenizing laser-light intensity distribution from output aperture 56.

Further by way of example, in place of a rectangular waveguide having a width sufficient to collect light from all emitters in a diode-laser bar, a linear array of individual optical-fibers or optical-waveguides, one for each emitter in the diode laser bar, may be used. Entrance ends of optical-waveguides or fibers in the array, of course, are preferably aligned with front surface 24 of a diode-laser bar 22. The individual fibers or waveguides may have a circular, elliptical or rectangular cross section. Such a linear waveguide-array may also be provided with a cylindrical or hemicylindrical lens, oriented transversely to optical-fibers or optical-waveguides in the array, for collecting light from the emitters and coupling it into the fibers or waveguides.

Figure 9:
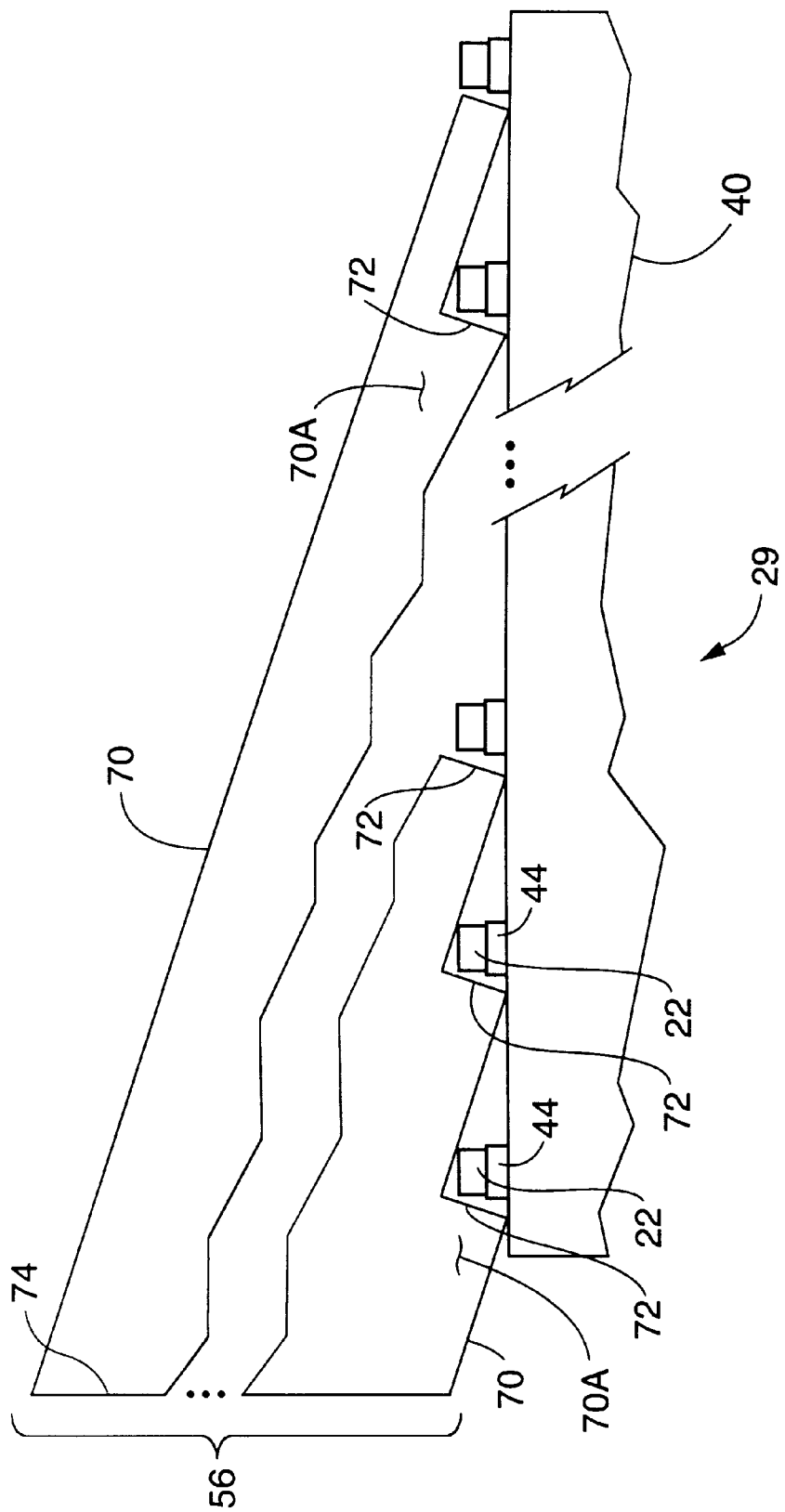
FIG. 9 is an elevation view schematically illustrating a further embodiment of a light-source in accordance with the present invention, similar to the embodiment of FIGS. 1 and 2, but wherein a single optical-waveguide collects laser-light emitted by all diode-laser bars.

It should further be noted that the present invention is not limited to arrangements in which an optical-waveguide or fiber array is required for each diode-laser bar. It is possible to fabricate an optical-waveguide which would collect emitted-light from two or more diode-laser bars, for example a waveguide having a stepped entrance end. FIG. 9 depicts a light-source 29 including such a waveguide arrangement. In this arrangement, a single optical-waveguide 70 replaces individual optical-waveguides 50 of above-described embodiments. Optical-waveguide 70 has a stepped entrance end 70A including a plurality of entrance-facets 72, one thereof aligned with each diode-laser bar 22. A single exit surface 74 provides exit aperture 56 of light-source 29. A waveguide such as waveguide 70 may be conveniently formed from a solid plastic material. A similar arrangement is possible using a hollow metal or plastic conduit with light-reflecting inner surfaces. Entrance faces 72 may be inclined as discussed above with reference to FIG. 4, for improving coupling of laser-light into optical-waveguide 70. A single waveguide may also be used with the stepped array described above with reference to FIG. 6 or with the "inclined diode-laser bar" arrangement of FIG. 8.

Figure 10:
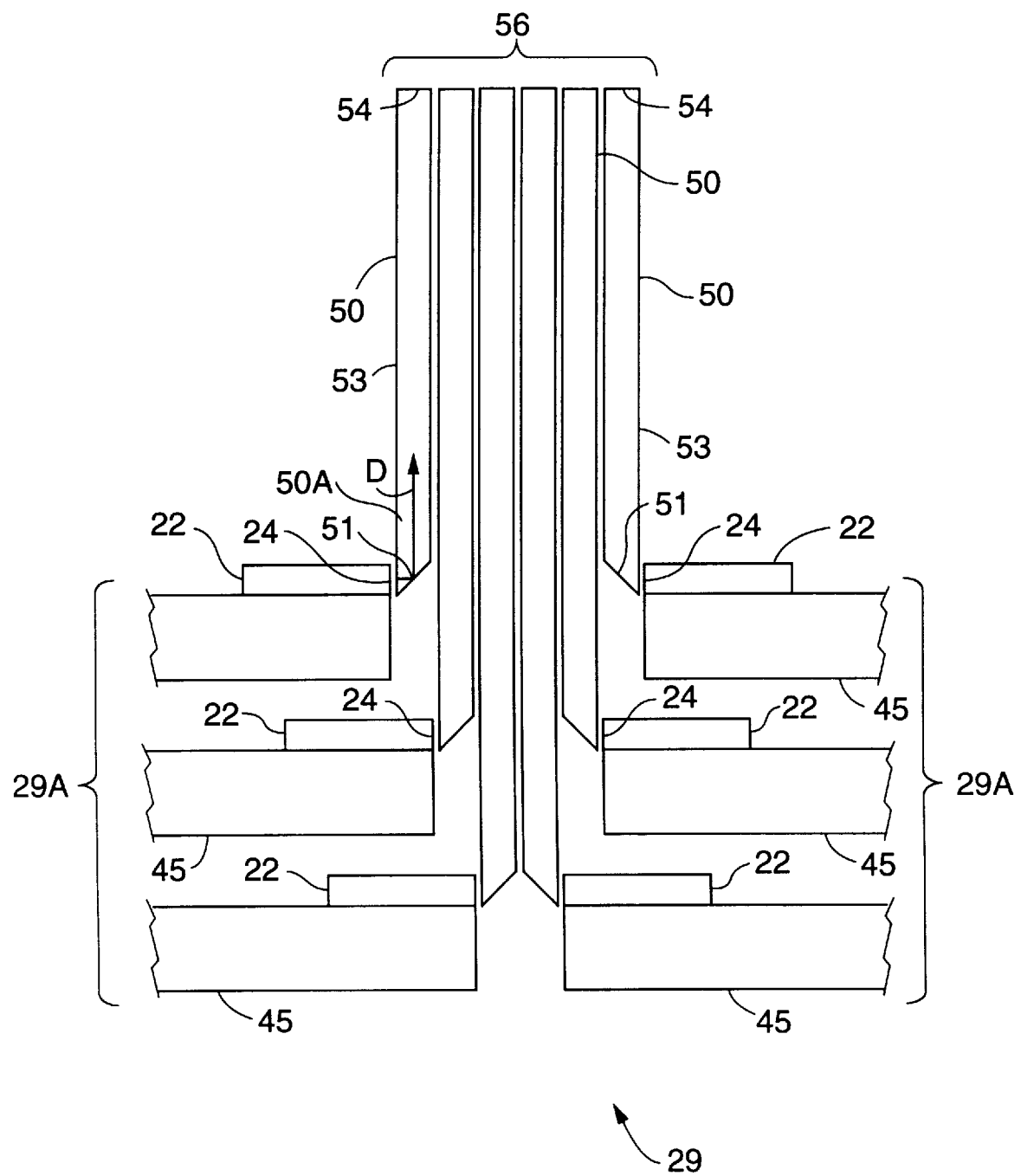
FIG. 10 is an elevation view schematically illustrating one preferred embodiment of a light-source in accordance with the present invention, including an array of diode-laser bars spaced apart both in and perpendicular to the emission direction thereof, and an array of planar optical-waveguides of different lengths for concentrating light emitted by the diode-laser bars in an output aperture of the light source.

Referring now to FIG. 10, a further embodiment 29 of a light-source in accordance with the present invention is illustrated. Light source 29 includes an array of pairs diode-laser bars 22, with the diode-laser bars of each pair having front surfaces 24 thereof facing each other and spaced apart in the emission-direction, and the pairs of diode laser bars spaced apart from each other in a direction perpendicular to the emission direction. The emission-direction spacing of the pairs of diode-laser bars is progressively increased from a first pair to a last pair, such that each diode-laser bar in the array can have an optical waveguide 50 associated therewith for collecting light emitted therefrom. Each optical-waveguide 50 is arranged with the length direction thereof perpendicular to the emission-direction of the diode-laser bar with which it is associated. Light enters a waveguide at an entrance-end 50A thereof through a guiding surface 53, and is reflected internally in a direction D along the waveguide from an inclined reflecting face 51, as described above with reference to FIG. 7. This, combined with a suitable emission-direction spacing of the diode-laser bars, allows waveguides 50 to be arranged in a close-packed array, concentrating the light output of the diode-laser bars in an output aperture 56.

Those skilled in the art to which the present invention pertains will recognize that the arrangement of FIG. 10 can be defined as a symmetrical combination of two arrays 29A. Each array 29A includes diode-laser bars 22 spaced apart from each other in a direction perpendicular to the emission-direction with front surfaces thereof spaced-apart in the emission direction. Spacing in the direction perpendicular to the emission-direction is preferably sufficient to allow each diode-laser bar to be mounted on a separate heat-sink 45. Heat sinks 45 may be provided with any well-known active cooling arrangement.

The present invention has been described in terms of a preferred and other embodiments. The present invention is not limited, however, to those embodiments described and depicted. Rather, the invention is defined by the claims appended hereto.

What is claimed is:

1. A light-source comprising:
 a heat-sink having a planar surface;
 a plurality of diode-laser bars each thereof having a front surface said front surface having a plurality of diode-laser emitting-areas therein;
 said diode-laser bars arranged in an array with said front surfaces thereof facing generally in the same direction and said diode-laser bars spaced-apart from each other in that direction, and thermally coupled to said planar surface of said heat-sink; and
 means for collecting laser-light emitted from said diode-laser bars and delivering said collected laser-light to an output aperture of the light-source.

2. The light-source of claim 1, wherein said diode-laser bars are facing in a direction parallel to said planar surface of said heat sink.

3. The light-source of claim 2, wherein said laser-light collecting means includes a plurality of optical-waveguides, one thereof associated with each of said diode-laser bars, each of said optical-waveguides having an elongated, generally rectangular entrance-face and an exit-face, said entrance-face located proximate the front surface of the said diode-laser bar with which it is associated for receiving laser-light emitted from said diode-laser emitting-areas, said received laser-light propagating along said optical-waveguide to said exit-face thereof.

4. The light-source of claim 3 wherein each of said plurality of optical-waveguides, in the vicinity of the diode-laser bar with which it is associated, is inclined at an angle to said planar surface of said heat sink.

5. The light-source of claim 4 wherein said inclination angle of said optical-waveguide is sufficient that the optical-waveguide may extend freely over an adjacent one of said diode-laser bars.

6. The light-source of claim 5 wherein the entrance face of each of said optical-waveguides has a width sufficient to collect laser-light from each emitting-area in said front surface.

7. The light-source of claim 4, wherein said entrance-face of a said optical-waveguide is at a wedge-angle to a plane perpendicular to the length direction of the optical-waveguide and light emitted from said emitting-areas is incident on said entrance-face at an incidence-angle from a normal thereto equal to the sum of said wedge-angle and said inclination-angle of said optical-waveguide, said incidence-angle being selected according to the refractive index of said optical-waveguide such that emitted light incident on said entrance-face is refracted into said optical-waveguide in a direction parallel to the length direction thereof.

8. The light-source of claim 7, wherein said incidence angle is Brewster's angle for the refractive index of the optical-waveguide.

9. The light-source of claim 1, wherein said light collecting means includes a single optical-waveguide arranged to collect laser-light emitted by two or more of said plurality of diode-laser bars.

10. The light-source of claim 1, wherein said light collecting means includes a single optical-waveguide arranged to collect laser-light emitted by all of said plurality of diode-laser bars.

11. A light-source comprising:
 a heat-sink having a planar surface;
 a plurality of diode-laser bars each thereof having a front surface, said front surface having a plurality of diode-laser emitting-areas therein, laser-light being emitted from said emitting-areas in an emission-direction generally perpendicular to said front surface;
 said diode-laser bars arranged in an array with said front surfaces thereof facing in said emission-direction, said diode-laser bars being spaced-apart from each other in said emission-direction, and being thermally coupled to said planar surface of said heat-sink with said emission-direction thereof parallel to said planar surface of said heat sink;
 a plurality of rectangular optical-waveguides, one thereof associated with each of said diode-laser bars, each of said optical-waveguides having an elongated, generally rectangular entrance-face and an exit-face, said entrance-face located proximate the front surface of the said diode-laser bar with which it is associated for receiving laser-light emitted from said diode-laser emitting-areas, said received laser-light propagating along said optical-waveguide to said exit-face thereof;
 each of said plurality of optical-waveguides being inclined, in the vicinity of the said diode-laser bar with which it is associated, at an angle to said planar surface of said heat-sink, said inclination-angle being sufficient that the optical-waveguide may extend freely over an adjacent one of said diode-laser bars; and
 said exit-faces of said optical-waveguides arranged to collectively provide an output aperture of the light-source.

12. The light-source of claim 11, wherein said entrance-face of a said optical-waveguide is at a wedge-angle to a plane perpendicular to the length direction of the optical-waveguide and light emitted from said emitting-areas is incident on said entrance-face at an incidence-angle from a normal thereto equal to the sum of said wedge-angle and said inclination-angle of said optical-waveguide, said incidence-angle being selected according to the refractive index of said optical-waveguide such that emitted light incident on said entrance-face is refracted into said optical-waveguide in a direction parallel to the length direction thereof.

13. The light-source of claim 12, wherein said incidence angle is Brewster's angle for the refractive index of the optical-waveguide.

14. A light-source comprising:

a plurality of diode-laser bars each thereof having a front surface, said front surface having a plurality of diode-laser emitting-areas therein, laser-light being emitted from said emitting-areas in an emission-direction generally perpendicular to said front surface;

said diode-laser bars arranged in an array with said front surfaces thereof facing in said emission-direction, said diode-laser bars being spaced-apart from each other in said emission-direction, and being located in a plane parallel to said emission-direction;

a plurality of rectangular optical-waveguides, one thereof associated with each of said diode-laser bars, each of said optical-waveguides having an entrance end including an end-face polished at an angle to the length direction of said optical-waveguide;

each of said optical-waveguides having said entrance-end thereof aligned with the diode-laser bar with which it is associated and being oriented in the vicinity of said diode-laser bar about perpendicular to said emission direction such that laser-light emitted from said diode-laser emitting-areas enters said optical-waveguide laterally and is reflected internally from said end face thereof along the length direction of said optical-waveguide to said exit-face thereof; and said exit-faces of said optical-waveguides arranged to collectively provide an output aperture of the light-source.

15. The light-source of claim 14, wherein said end-face is furnished with a reflective coating.

16. The light-source of claim 14 wherein said end face is inclined to said emission-direction at an angle between about 40 and 50 degrees.

17. A light-source comprising:

a plurality of diode-laser bars each thereof having a front surface, said front surface having a plurality of diode-laser emitting-areas therein, laser-light being emitted from said emitting-areas in an emission-direction generally perpendicular to said front surface;

said diode-laser bars arranged in an array with said front surfaces thereof facing in said emission-direction, said diode-laser bars being spaced-apart from each other at least in said emission-direction, and being located in a plane parallel to said emission-direction; and a single optical-waveguide, said optical-waveguide having an entrance end and an exit face, said entrance end arranged to collect laser light-emitted by all of said plurality of diode-laser bars collected light and guide said collected light to an exit face of said optical-waveguide, said output face providing an output-aperture of the light-source.

18. A light-source comprising:

a heat-sink having am planar surface;

a plurality of diode-laser bars each thereof having a front surface, said front surface having a plurality of diode-laser emitting-areas therein, laser-light being emitted from said emitting-areas in an emission-direction generally perpendicular to said front surface;

said diode-laser bars arranged in an array with said front surfaces thereof facing in said emission-direction, said diode-laser bars being spaced-apart from each other in said emission-direction, and being thermally coupled to said planar surface of said heat-sink, with said emission-direction of said diode-laser bars being at an inclination angle to said planar surface of said heat-sink; and wherein said inclination angle and said spacing of said diode laser bars is selected such that laser-light emitted from a said diode-laser bar is directed over an adjacent said diode-laser bar in said emission direction.

19. The light-source of claim 18, further comprising a plurality of rectangular optical-waveguides, one thereof associated with each of said diode-laser bars, each of said optical-waveguides having an elongated, generally rectangular entrance-face and an exit-face, said entrance-face perpendicular to the length direction of said optical-waveguide and located proximate the front surface of the said diode-laser bar with which it is associated for receiving laser-light emitted from said diode-laser emitting-areas, said received laser-light propagating along said optical-waveguide to said exit-face thereof, each of said plurality of optical-waveguides being inclined, in the vicinity of the said diode-laser bar with which it is associated, at said inclination angle to said planar surface of said heat-sink.

20. The light-source of claim 19, wherein said exit-faces of said optical-waveguides are collectively arranged to provide an output-aperture of the light-source.

21. The light source of claim 18, wherein each of said diode-laser bars is thermally coupled to said planar surface of said heat sink via a wedged shaped spacer, said spacer having a lower surface thereof in thermal contact with said planar surface of said heat sink and an upper surface thereof in thermal contact with said diode-laser bar, and with the inclination angle of the wedged shape of the spacer defining said inclination angle between the emission-direction of said diode-laser bars and the planar surface of said heat-sink 22. The light source of claim 21 wherein said spacers are made of an electrically conductive material.

* * * * *